United States Patent
Ebi et al.

(10) Patent No.: US 8,769,993 B2
(45) Date of Patent: Jul. 8, 2014

(54) SILICON ELECTROMAGNETIC CASTING APPARATUS

(75) Inventors: Daisuke Ebi, Tokyo (JP); Mitsuo Yoshihara, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 13/814,809

(22) PCT Filed: Nov. 17, 2010

(86) PCT No.: PCT/JP2010/006742
§ 371 (c)(1),
(2), (4) Date: Feb. 7, 2013

(87) PCT Pub. No.: WO2012/020462
PCT Pub. Date: Feb. 16, 2012

(65) Prior Publication Data
US 2013/0133374 A1    May 30, 2013

(30) Foreign Application Priority Data

Aug. 11, 2010    (JP) .................................. 2010-179964

(51) Int. Cl.
*C03B 15/00*    (2006.01)

(52) U.S. Cl.
USPC ........................................................ 65/356

(58) Field of Classification Search
USPC ........... 65/356, 355, 135.6; 423/348; 373/140
See application file for complete search history.

(56) References Cited

U.S. PATENT DOCUMENTS

| | | | | |
|---|---|---|---|---|
| 4,915,723 A | * | 4/1990 | Kaneko et al. ................... | 65/144 |
| 6,695,035 B2 | * | 2/2004 | Kimura et al. ................ | 164/507 |
| 6,889,527 B1 | * | 5/2005 | Romer et al. .................... | 65/347 |
| 7,294,233 B2 | * | 11/2007 | Banerjee et al. .............. | 162/192 |
| 7,503,188 B2 | * | 3/2009 | Girold et al. .................. | 65/135.6 |
| 7,682,472 B2 | * | 3/2010 | Kaneko .......................... | 148/538 |
| 7,730,745 B2 | * | 6/2010 | Girold et al. .................. | 65/135.6 |
| 7,749,324 B2 | * | 7/2010 | Yoshihara et al. .............. | 117/18 |
| 2003/0205358 A1 | * | 11/2003 | Kimura et al. ................ | 164/493 |
| 2007/0039544 A1 | * | 2/2007 | Kaneko .......................... | 117/81 |
| 2008/0179037 A1 | * | 7/2008 | Yoshihara et al. ............. | 164/460 |
| 2008/0210156 A1 | * | 9/2008 | Sasatani et al. ................. | 117/81 |
| 2009/0044926 A1 | * | 2/2009 | Kida et al. .................... | 164/507 |
| 2012/0230902 A1 | * | 9/2012 | Kaneko .......................... | 423/348 |
| 2012/0236898 A1 | * | 9/2012 | Keough ......................... | 373/142 |
| 2012/0244061 A1 | * | 9/2012 | Kaneko .......................... | 423/348 |

FOREIGN PATENT DOCUMENTS

| | | |
|---|---|---|
| JP | 4-285095 | 10/1992 |
| JP | 2001-19593 | 1/2001 |
| JP | 2008-174397 | 7/2008 |

\* cited by examiner

*Primary Examiner* — Mark Halpern
(74) *Attorney, Agent, or Firm* — Clark & Brody

(57) ABSTRACT

Provided is a silicon electromagnetic casting apparatus that is capable of stably producing polycrystalline silicon used as a solar cell substrate material, having a bottomless cold mold and an induction heating coil, the apparatus for pulling down the silicon melted through electromagnetic induction heating by means of the induction coil and solidifying the silicon melt; further including a plasma torch for generating a transferable plasma arc and a top heater configured so as to face a top surface of the molten silicon, the top heater for generating heat through electromagnetic induction by means of the induction coil. The apparatus enables, upon production of a high quality polycrystalline silicon ingot as a solar cell substrate material along with plasma heating, stable production thereof without cracking in a final solidification portion.

8 Claims, 4 Drawing Sheets

(a)

(b)

(a)

Before Heating (b)

After Heating (a) Before Heating (b) After Heating

Prior Art

SILICON ELECTROMAGNETIC CASTING APPARATUS

This application is a 371 of PCT/JP2010/006742 filed 17 Nov. 2010.

TECHNICAL FIELD

The present invention relates to a silicon electromagnetic casting apparatus for producing a silicon ingot by applying a continuous casting technology through electromagnetic induction, particularly to a silicon electromagnetic casting apparatus that is capable of stably producing polycrystalline silicon used as a solar cell substrate material in association with plasma heating by means of plasma arc.

BACKGROUND ART

When a continuous casting apparatus through electromagnetic induction to which a bottomless cold mold partly divided along a circumferential direction is disposed (hereinafter, referred to as "electromagnetic casting apparatus") is used, a molten substance (molten silicon herein) and the mold are in almost no contact with each other; resulting in an ingot (silicon ingot) without an impurity contamination. Further, a significant reduction of production cost can be achieved because of an advantage that the apparatus does not require a highly-pure material as a material of the mold since there is no contamination from the mold and because a continuous casting can be performed. Therefore, the electromagnetic casting apparatus has conventionally been applied to the production of polycrystalline silicon used as a solar cell substrate material.

FIG. 6 is a view schematically showing a configuration example of an electromagnetic casting apparatus preferable to produce polycrystalline silicon. As shown in the figure, copper plate-shape elements elongated in a vertical direction of which interior can be cooled with water are arranged inside an induction heating coil 2 in parallel to the direction of an axis of the induction coil 2, each element being in a mutually-insulated state inside the induction coil 2. A space surrounded by these plate-shape elements constitutes a mold (that is, a bottomless cold mold of which side wall is cooled with water) 1. In general, a water cooling copper mold in which a plate-shape element is made of copper is used as the cold mold 1.

A support base 7, which is downwardly movable, is installed in a lower end position of the induction heating coil 2 (that is, a position corresponding to a bottom part of the cold mold 1). Below the induction heating coil 2, a heat retention device 5 for warming a solidified ingot (a silicon ingot) 8 so as to prevent abrupt cooling is installed. Below the heat retention device 5, a heat retention cylindrical body 9 is attached. The silicon ingot 8 is withdrawn downwardly by a withdrawing device (not shown).

Above the cold mold 1, a raw material feeder 10 capable of feeding a raw material into the mold 1 during melting is installed. Further, in this example, a heating member 11 for heating raw material silicon as necessary is attached above the mold 1. It is preferable for a plasma torch to be arranged as the heating member 11 so as to perform plasma arc heating as necessary.

These devices are installed in a sealed container 6 so that molten silicon 4 and the high-temperature silicon ingot 8 are not brought into direct contact with the atmosphere. In general, an interior of the container 6 can be replaced with an inert gas so as to perform continuous casting in a slightly pressurized state.

Upon production of polycrystalline silicon, when the silicon material is charged into the mold 1 and a high-frequency induction current is applied to the induction heating coil 2, the material is heated and melted. The molten silicon 4 in the mold 1 repels the plate-shape elements due to the induction current and is immune from contacting with a side wall of the mold 1. When the support base 7 is gradually moved downward after the molten silicon 4 is sufficiently homogenized, cooling is started as part of the molten silicon leaves away from the induction coil 2, unidirectional solidification for the relevant molten silicon 4 in the mold 1 is developed, and the silicon ingot 8 having the same sectional shape as that of the mold is formed.

In accordance with a downward movement amount of the support base 7, an amount of the molten silicon 4 is decreased. Thus, by compensating the same amount of the material silicon from the raw material feeder 10 so as to constantly maintain an upper surface of the molten silicon 4 at the same height level, and continuously performing heating and melting, withdrawing, and raw material supply; the polycrystalline silicon ingot 8 can continuously be produced.

In order to improve the quality of polycrystalline silicon produced using this electromagnetic casting apparatus, in particular, to enhance a conversion efficiency when polycrystalline silicon is used particularly as a solar cell substrate (a ratio of energy capable of being converted into electric energy and taken out relative to incident optical energy), a lot of technology developments have been conducted in the past.

For example, PATENT LITERATURE 1 discloses a casting method of polycrystalline silicon in which a frequency of an alternating current supplied to an induction coil is 25 to 35 kHz. According to the casting method described in the above document, by increasing the frequency of the alternating current, a skin effect is generated in molten silicon and current density on a surface is increased. Accordingly, a surface temperature of an ingot is maintained at a high temperature and start of solidification due to cooling from the surface is delayed, so that growth of a chill layer on the ingot surface (of which crystal grain size is small and on which many crystal faults exist, so that a semiconductor characteristic is not preferable) can be suppressed. Further, since a coil current can be lowered, an electromagnetic stirring force acting on the molten silicon can be reduced so as to suppress stirring of the molten silicon. As a result, the growth of a crystal having a large grain size is facilitated, so that the conversion efficiency as a solar cell can be improved.

PATENT LITERATURE 2 discloses a silicon continuous casting method in which both electromagnetic induction heating of an induction coil and plasma heating of a transferable plasma arc are used, so that the quality as a solar cell is improved. According to the casting method described in the same document, by using therewith the plasma heating for melting a material during casting, the load of the electromagnetic induction heating can be reduced, and by suppressing thermal convection of molten silicon due to an electromagnetic force and suppressing a downward heat flow rate, a solid-liquid interface is flattened. As a result, a temperature gradient in a radial direction of a silicon ingot immediately after solidification is reduced and thermal stress generated inside a crystal is mitigated, so that the generation of crystal defects, which deteriorates the conversion efficiency of a solar cell, is suppressed.

According to such a casting method through this electromagnetic induction, a polycrystalline silicon ingot having a high conversion efficiency when the ingot is used as a solar cell substrate can be produced. However, in an actual operation, at the time of final solidification at which casting ends, solidification is started from an upper surface of the molten silicon in the mold and the central portion of the molten silicon is solidified lastly. As a result, due to volume expansion of the solidified part, cracking is generated in a finally solidified part of the ingot and that part has to be cut off and removed as an unusable part, so that a yield ratio is lowered.

As a solution of this problem, PATENT LITERATURE 3 proposes a silicon continuous casting method in which, in the end of the casting, a heating member which generates heat by itself due to electromagnetic induction of an induction coil is disposed so as to face a silicon melt remaining in a bottomless crucible from above, thereby preventing the solidification of the silicon melt from an upper surface, during which the solidification of the silicon melt is finished. According to the casting method described in the same document, cracking in a solidified part of the remaining melt can be prevented, and the crystal directionality similar to the other parts is given to this part, so that a high quality is obtained over the entire ingot. Thus, the casting method delivers a great effect for improving a yield ratio of production of the silicon ingot.

However, in the silicon continuous casting method described in PATENT LITERATURE 3, a silicon material is melted only through electromagnetic induction heating, without plasma heating by means of plasma arc or the other heating methods. There is a need for confirmation for application to electromagnetic casting in which the plasma heating is used as an auxiliary heat source.

In the continuous casting method described in PATENT LITERATURE 3, as described in an embodiment thereof, sizes of the produced ingot are 85 mm square and 117 mm square. It is unknown whether the casting method can be applied without any problems to such a case where a large ingot in a square form having a side length of 300 mm or more is produced.

CITATION LIST

Patent Literature

PATENT LITERATURE 1: Japanese Patent Application Publication No. 2008-174397
PATENT LITERATURE 2: Japanese Patent Application Publication No. 2001-19593
PATENT LITERATURE 3: Japanese Patent Application Publication No. 4-285095

SUMMARY OF THE INVENTION

Technical Problem

An object of the present invention is to provide a silicon electromagnetic casting apparatus to which the casting method disclosed in PATENT LITERATURE 1 or 2 described above is applied, and which enables, upon production of a high quality polycrystalline silicon ingot used as a material for a solar cell substrate in association with plasma heating by means of plasma arc, even in the case where a large ingot in a square form having a side length of 300 mm or more is produced, stable production thereof without cracking in a final solidification portion.

Solution to Problem

In order to solve the above problems, the present inventors performed polycrystalline silicon continuous casting using an electromagnetic casting apparatus in which a water cooling copper mold having a cross section of 345 mm×345 mm or 345 mm×505 mm is installed, the apparatus being capable of using electromagnetic induction heating and plasma heating together. At that time, in a solidification step after final material supply at which casting ends, after the use of plasma ends, using a heating member as generating heat by itself due to electromagnetic induction of an induction heating coil, final solidification was performed while heat retention was performed from above. It should be noted that, since a heating device disposed above the mold is referred to as heating member in the present description (refer to FIG. 1 described above), the heating member which is used after the use of plasma ends in the final solidification step will be referred to as "top heater".

As a result of the casting, a high quality polycrystalline silicon was obtained over the entire ingot. However, it was found that cracking which seemed to be caused by a volume expansion due to solidification was sometimes generated in a final solidification part of the ingot. Cracking is often generated in the case where a frequency of an alternating current supplied to an induction coil is 25 to 35 kHz.

Based on this examination result, a heat generation pattern of the top heater when final solidification of molten silicon is performed using the top heater, and a consequent heating pattern on a surface of the molten silicon were examined.

FIG. 1 is a view showing an arrangement position of a top heater at the time of final solidification of molten silicon, in which FIG. 1(a) is a vertically sectional view, and FIG. 1(b) is an A-A arrow view of FIG. 1(a). As shown in the figures, an induction heating coil 2 is arranged on an outer periphery of a water cooling copper mold 1, and a top heater 3 for generating heat through electromagnetic induction by means of the induction coil 2 is arranged so as to face a melt surface immediately above molten silicon 4 in the mold 1. A surface of the top heater 3 facing the molten silicon surface 4 has a rectangular shape, which is similar to a sectional shape of the mold 1 (a rectangular shape in this case), so as to widely cover a liquid surface of the molten silicon 4. It should be noted that a heat retention device 5 for preventing abrupt cooling of a silicon ingot is installed below the induction coil 2.

FIG. 2 is a view schematically showing a heat generation pattern in the top heater, in which FIG. 2(a) shows a state before electric power is applied to an induction heating coil to perform heating, and FIG. 2(b) shows a state after the heating. As shown in FIG. 2(b), since an induction current is generated on an outer periphery of the top heater 3, the outer periphery of the top heater 3 (a shaded part) mainly generates heat and thus the molten silicon 4 has the highest temperature in the vicinity of an outer peripheral part.

FIG. 3 is a view for illustrating a heating pattern on a top surface of the molten silicon in a mold in the case where the top heater in the heat generation pattern shown in FIG. 2 is used. As shown in the figure, the temperature of the molten silicon is increased immediately below the outer periphery of the top heater 3 (the shaded part) and in the vicinity thereof (that is, a part shown by the reference sign "a" in the vicinity of the outer peripheral part of the molten silicon 4), and the temperature is decreased on the inner side of the outer peripheral part of the molten silicon 4 (that is, a part shown by the reference sign "b" of an upper surface in the vicinity of the central part).

Since the solidification of the molten silicon is started from a part where the temperature is low, solidification is started from the upper surface in the vicinity of the central part of the molten silicon 4 (the part shown by the reference sign "b"), and molten silicon remaining under the upper surface (particularly a central part thereof) is solidified lastly. As a result, due to volume expansion of the part solidified lastly, cracking is generated in a finally solidified part of the ingot.

At the time of the casting, in the case where cracking is generated in the finally solidified part of the ingot, it is assumed that a heating pattern of a molten silicon top surface is represented by FIG. 3.

Therefore, the present inventors attempted to use a top heater which was divided into three elements so that the outer peripheral part of each element that generates heat is multiplied and the heat spreads over the vicinity of the central part of the silicon. The heat generation pattern of the top heater at that time and a consequent heating pattern on the molten silicon top surface are shown in FIGS. 4 and 5 to be described later. The temperature is immune from decreasing in the vicinity of the central part on the molten silicon top surface, and the temperature of the entire top surface of the molten silicon becomes sufficiently high. When casting was actually performed, no generation of cracking was found and a preferable result was obtained.

The present invention is achieved based on such findings and the summary thereof resides in the following silicon electromagnetic casting apparatus.

That is, the silicon electromagnetic casting apparatus is a silicon electromagnetic casting apparatus including: a conductive bottomless cold mold in which part thereof in an axial direction is divided into a plurality of elements along a circumferential direction, and an induction coil surrounding the mold, the silicon electromagnetic casting apparatus for pulling down the silicon melted through electromagnetic induction heating by means of the induction coil and solidifying the silicon; further including: a plasma torch as a heating source installed above the cold mold so as to be raised or lowered, the plasma torch generating a transferable plasma arc, and a top heater configured so as to face a top surface of the molten silicon in the cold mold to generate heat through electromagnetic induction by means of the induction coil.

Herein, the phrase "so as to face a top surface of the molten silicon" indicates that the molten silicon top surface and the top heater (indicating that a lower surface of the top heater faces the molten silicon top surface) are disposed to face each other with a small spacing as much as about 30 to 100 mm, for example.

It is preferable for the top heater to have a structure in which the top heater is suspended from the plasma torch in the silicon electromagnetic casting apparatus of the present invention, since it allows relatively easy translating, raising, and lowering of the top heater with simple facilities and operations.

It is preferable for the top heater to be divided into two or more in the silicon electromagnetic casting apparatus of the present invention, since it enables an increased temperature of the entire top surface of the molten silicon at the time of final solidification so that a high quality polycrystalline silicon can be obtained.

When a frequency of an alternating current applied to the induction coil is 25 to 35 kHz in the silicon electromagnetic casting apparatus of the present invention, a high quality polycrystalline silicon having a high conversion efficiency particularly as a solar cell can be obtained.

In the silicon electromagnetic casting apparatus of the present invention, even in the case where a square or rectangular mold having a side length of 300 mm or more is used as the cold mold, a high quality polycrystalline silicon can stably be produced without cracking in a finally solidified part of an ingot.

Advantageous Effects of Invention

A silicon electromagnetic casting apparatus of the present invention is an apparatus for producing a polycrystalline silicon ingot in association with plasma heating by means of plasma arc, and the apparatus includes a top heater for heating a molten silicon top surface at the time of final solidification. This apparatus enables to produce a high quality polycrystalline silicon ingot used as a solar cell substrate material without cracking in a final solidification position.

Even in the case where a large ingot is produced, it is possible to stably produce the ingot and improve a production yield ratio of the ingot.

BRIEF DESCRIPTION OF THE DRAWINGS

FIG. 1 is a view showing an arrangement position of a top heater at the time of final solidification of molten silicon, in which FIG. 1(a) is a vertically sectional view, and FIG. 1(b) is an A-A arrow view of FIG. 1(a).

FIG. 2 is a view schematically showing a heat generation pattern in the top heater, in which FIG. 2(a) shows a state before electric power is applied to an induction heating coil to perform heating, and FIG. 2(b) shows a state after the heating.

FIG. 4 is a view schematically showing a heat generation pattern of a divided-type top heater used in an electromagnetic casting method of the present invention, in which FIG. 4(a) shows a state before electric power is applied to an induction heating coil to perform heating, and FIG. 4(b) shows a state after the heating.

DESCRIPTION OF EMBODIMENTS

Figure 1:
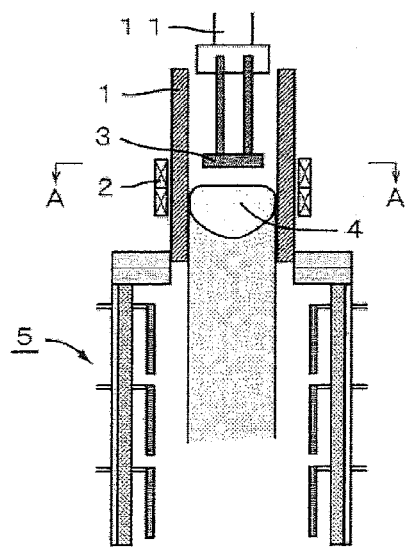
Figure 1:
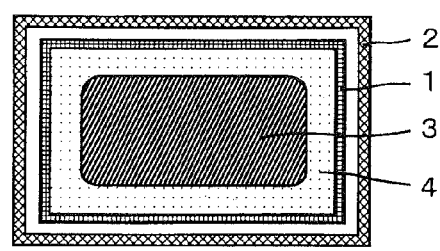
Figure 2:
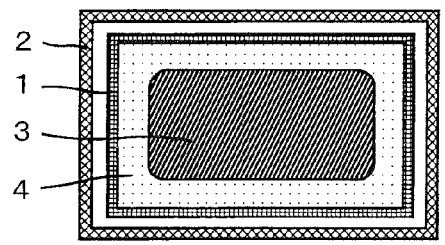
Figure 2:
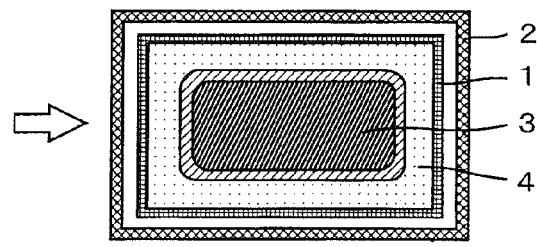
Figure 3:
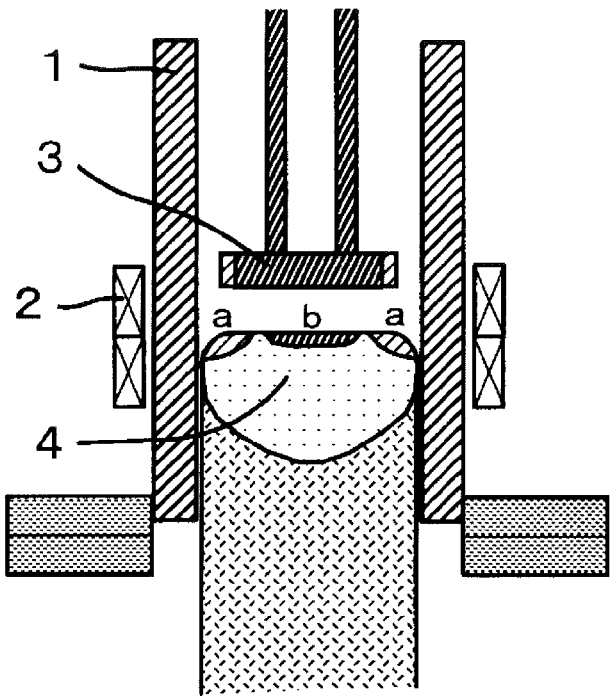
FIG. 3 is a view for illustrating a heating pattern on a top surface of the molten silicon in a mold in the case where the top heater in the heat generation pattern shown in FIG. 2 is used.

A silicon electromagnetic casting apparatus of the present invention is, as a premise, an electromagnetic casting apparatus having a conductive bottomless cold mold in which a part thereof in the axial direction is divided into plural parts in the circumferential direction and an induction coil surrounding the mold.

The reason why an electromagnetic casting apparatus is premises on is that the apparatus enables, upon production of polycrystalline silicon used as a solar cell substrate material, casting in the mold with almost no contact between molten silicon and the mold and production of a silicon ingot without metal contamination from the mold by which a conversion efficiency can favorably be maintained There is no need for using a highly pure material as a material of the mold and casting can continuously be performed, so that a significant reduction of production cost can be achieved.

The electromagnetic casting apparatus of the present invention is further characterized by having a plasma torch as a heating source installed above the cold mold so as to be raised or lowered, the plasma torch for generating a transferred plasma arc, and a top heater for generating heat through electromagnetic induction by means of the induction coil. The top heater is disposed so as to face a top surface of the molten silicon in the cold mold.

The electromagnetic casting apparatus of the present invention has the plasma torch for generating the transferable plasma arc, in order to produce a polycrystalline silicon of which quality as a solar cell (particularly conversion efficiency) is improved by suppressing thermal convection of the molten silicon due to an electromagnetic force, as described in PATENT LITERATURE 2 stated above. A conventionally used plasma torch may be used as the plasma torch for generating the transferable plasma arc.

Further, the top heater is provided in order to obtain a high quality polycrystalline silicon over the entire ingot by performing final solidification while heat retention is performed on the molten silicon top surface from above in a solidification step after final material supply at which casting ends, and preventing cracking in a finally solidified part of the ingot. As a heat source therefor, the top heater generates heat through electromagnetic induction by means of the induction coil installed on the outer periphery of the mold and this heat is utilized.

The top heater is defined to be formed so as to face the molten silicon surface in the cold mold, in order to generate heat through the electromagnetic induction by means of the induction coil and to radiate the heat from a short distance to the molten silicon top surface so as to retain the heat on the molten silicon surface in the mold. When the top heater is away from the molten silicon top surface, the top heater does not generate a sufficient heat since it becomes hard to receive the electromagnetic induction, and radiation heat is significantly attenuated.

A configuration that enables the top heater to face the molten silicon top surface is not limited to a specific method. Since the plasma torch is installed above the mold, a method for arranging the top heater above the mold and lowering the top heater as necessary cannot be employed. However, it seems that, for example, a system permitting the top heater to move from an independently provided standby position to where the top heater faces the molten silicon top surface can be employed by combining translation movement in a horizontal direction with raising/lowering movement. Nevertheless, in that case, the arrangement of a raising/lowering mechanism for the plasma torch as well as horizontal translation movement and raising/lowering movement equipment for the top heater above the mold, and the switching etc. of the plasma torch over the top heater become unavoidably cumbersome and complicated.

Therefore, the present inventors employed a method of utilizing a raising and lowering mechanism for the plasma torch which supports, raises, and lowers the plasma torch. That is, as long as the top heater has a structure in which the top heater is suspended from the plasma torch, the top heater can be suspended from the plasma torch and lowered by the raising and lowering mechanism for the plasma torch, so that the top heater faces the molten silicon top surface in the cooing mold.

More specifically, for example, there can be employed a method of attaching a hook at a proper point of the plasma torch, attaching a jig to be engaged into the hook to the top heater so as to have a structure in which the top heater can be suspended (a structure in which a heat generation part of the top heater is placed below a lower end of the plasma torch), suspending the top heater from an arm that is swingably provided at a top heater standby sideward position, swinging the arm, and suspending the top heater from the hook of the plasma torch raising and lowering mechanism. According to this method, the plasma torch raising and lowering mechanism can also be used for raising and lowering the top heater, which enables a relatively easy translation movement, raising, and lowering of the plasma torch as well as the top heater with simple facilities and operations. Further, the top heater can be positively lowered, keeping pace with the lowering of a liquid surface position of the molten silicon along with downward movement of the solidified ingot.

In that case, by making a fixture as suspending the top heater from a carbon fiber material, electric discharging between the fixture and a generator main body can be avoided, so as to prolong the life of the fixture.

The top heater needs to have a resistance to generate heat by an induction current, a high heat resistance so as to withstand thermal deformation, and the like, and in addition to graphite and the like, metal such as molybdenum can be used. However, since metal contaminates the ingot and degrades the conversion efficiency as a solar cell, a solid carbon material (a compact carbonaceous material) is preferable. A carbon fiber material is also preferable for a top heater material.

It is preferable for a top heater surface facing the molten silicon top surface to have a slightly smaller area than but similar shape to a cross-sectional shape of the mold (a square or a rectangular in general). This is to cover the entire liquid surface of the molten silicon. In that case, it is preferable for a corner part of the top heater to have a curvature radius R of 10 mm or more. This is to suppress generation of cracking or chipping in the corner parts.

It is preferable for an area ratio (an occupancy area ratio) of the top heater surface facing the molten silicon top surface to the molten silicon top surface to be 60 to 70%. The radiation heat from an outer periphery of the top heater as generating heat by the electromagnetic induction reaches the molten silicon top surface with a constant extent of spread. Thus, the occupancy area ratio of 60 to 70% enables a sufficiently high temperature of the entire surface of the molten silicon.

In the silicon electromagnetic casting apparatus of the present invention, it is preferable to adopt a top heater that comprises two or more of divided elements.

Figure 4:
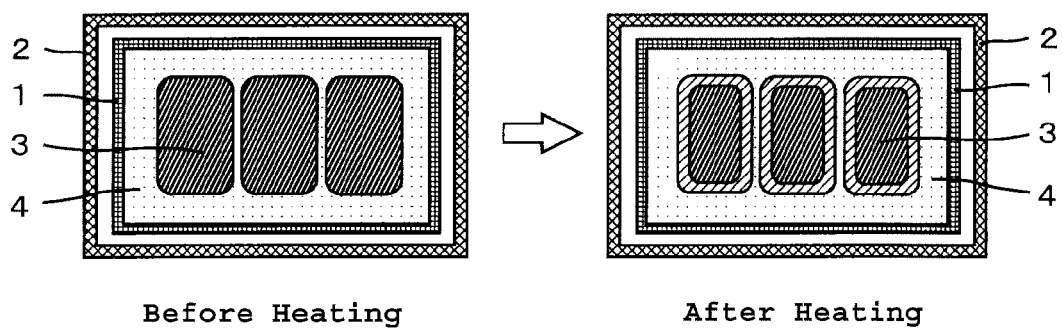

FIG. 4 is a view schematically showing a heat generation pattern of a divided-type top heater used in an electromagnetic casting method of the present invention, in which FIG. 4(a) shows a state before electric power is applied to an induction heating coil to perform heating, and FIG. 4(b) shows a state after the heating. The example shown in FIG. 4 is the case where the top heater comprises three divided elements. As shown in FIG. 4(b), since the induction current is generated on outer peripheries of the respective divided element of the top heater 3, the outer periphery of each divided element of the top heater 3 (shaded parts) mainly generates heat. As a result, the temperature of the molten silicon 4 becomes high not only in the vicinity of outer peripheral parts but also in regions inside the outer peripheral parts.

Figure 5:
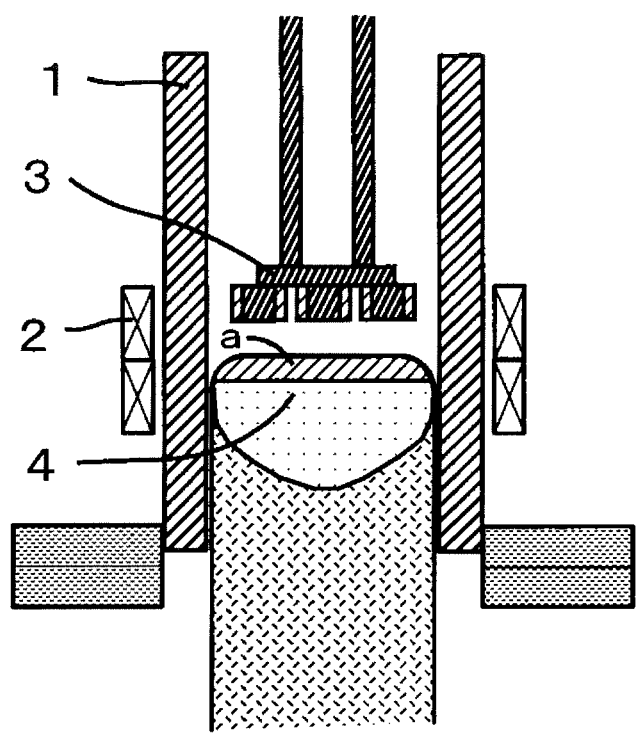
FIG. 5 is a view for illustrating a heating pattern on a top surface of molten silicon in a mold in the case where the top heater in the heat generation pattern shown in FIG. 4 is used.
Figure 6:
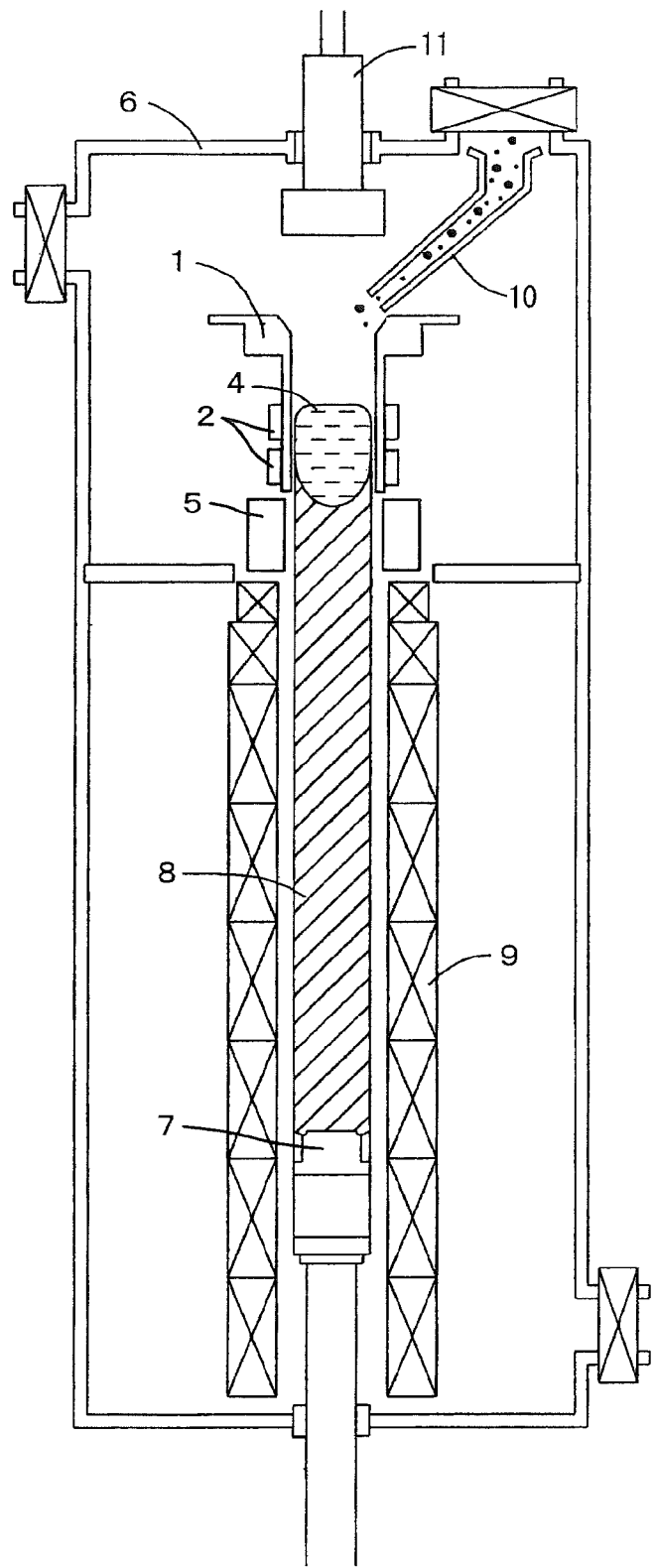
FIG. 6 is a view schematically showing a configuration example of an electromagnetic casting apparatus preferable to produce polycrystalline silicon.

FIG. 5 is a view for illustrating a heating pattern on a top surface of molten silicon in a mold in the case where the top heater in the heat generation pattern shown in FIG. 4 is used. As shown in the figure, the temperature of the molten silicon 4 becomes high immediately below the outer peripheries of the respective divided element of the top heater 3 (the shaded parts) and in the vicinity thereof. Thus, the temperature of the entire surface of the molten silicon 4 in the mold 1 (a part shown by the reference sign a) becomes high. As a result, solidification is uni-directionally developed from downward to upward. Thus, a high quality polycrystalline silicon can be obtained.

The top heater is divided into two or more elements because, even with the minimum division number of two, the induction current is generated on outer peripheries of the respective divided elements of the top heater, each outer periphery of the element generates heat, the heat spreads over the vicinity of the central part of the molten silicon surface layer, and the temperature of the vicinity of the central part thereof becomes high, so that unidirectional solidification is easily generated.

There is no particular upper limit of the division number of the divided-type top heater. This is because the size of the mold is limited and hence the upper limit is automatically set from a restraint or the like in terms of a facility configuration. From a view of bringing the entire top surface of the molten silicon into a high temperature state, the large division number thereof is advantageous and preferable. However, the division number exceeding four is not advantageous since a configuration of the top heater itself becomes complicated and facility cost becomes high. It is also presumed that an effect of dividing has an upper limit. It should be noted that elements of the divided-type top heater may have the same size or different size from each other.

In the silicon electromagnetic casting apparatus of the present invention, it is preferable for a frequency of an alternating current applied to the induction coil to be 25 to 35 kHz, since a high quality polycrystalline silicon having a high conversion efficiency particularly as a solar cell can be obtained as described in PATENT LITERATURE 1 stated above. This is because, although the frequency of the alternating current supplied to the induction coil is conventionally about 10 kHz, by increasing the frequency of the alternating current, current density on the molten silicon surface is increased and an ingot surface is maintained at a high temperature, so that growth of a chill layer on the ingot surface (of which crystal grain size is small and on which many crystal defects exist) can be suppressed.

In this case, the divided-type top heater used in a final solidification step enables to maintain a high temperature of the entire top surface of the molten silicon, so that stable casting can be performed.

The silicon electromagnetic casting apparatus of the present invention enables, even in the case where a large square or rectangular mold having at least a side length of 300 mm or more is used as the cold mold, stable production of a high quality polycrystalline silicon ingot without cracking in the finally solidified part of the ingot.

In the top heater, only the outer peripheral part generates heat. Thus, in the case where the large square or rectangular mold is used, it is difficult to maintain the entire top surface of the molten silicon at a high temperature. However, particularly in the case where the divided-type top heater is used, the outer peripheries of the respective divided elements of the top heater generate heat and the heat spreads over the vicinity of the central part of the molten silicon top layer. Thus, the entire surface of the molten silicon top surface layer can be maintained at a high temperature.

Upon production of the silicon ingot using the silicon electromagnetic casting apparatus of the present invention, a general operation method is basically applied. However, in the final solidification step at which casting ends, after the use of plasma ends, the top heater may face the molten silicon top surface and generate heat through the electromagnetic induction by means of the induction coil, so that final solidification is performed while heat retention is performed on the molten silicon top surface from above.

As described above, when the silicon electromagnetic casting apparatus of the present invention is used, upon production of a polycrystalline silicon ingot in association with plasma heating by means of plasma arc, a high quality polycrystalline silicon ingot used as a solar cell substrate material can be produced without generating cracking in a final solidification portion.

Even in the case where a large ingot is produced, stable production of the ingot and improvement of a production yield ratio of the ingot can be achieved.

EXAMPLES

By using the electromagnetic casting apparatus of the present invention having the plasma torch for generating the transferable plasma arc and including a divided-type top heater of which major parts are schematically shown in FIGS. 4 and 5, silicon ingots having section size of 345 mm×345 mm or 345 mm×505 mm and length of 4 m respectively were produced and examined for the absence or presence of cracking to be generated in finally solidified parts of the ingots. It should be noted that for comparison, the case where casting was performed without attaching the top heater was similarly examined.

The used top heater was made of carbonaceous substance, and a single top heater as being not divided, a divided-type top heater comprising two elements, or that comprising three elements was used. It should be noted that any of occupancy area ratios of the used top heater to the molten silicon top surface satisfies the desired area ratio (60 to 70%) described above. The frequency of the alternating current applied to the induction coil was 30 kHz or 12 kHz.

Examination results are shown in Table 1. In Table 1, a cracking generation ratio in the finally solidified parts of the ingots are indicated by a ratio (percentage) of the number of the ingots in which cracking was generated to the number of the ingots to be examined for the absence or presence of cracking to be generated by visual inspection. It should be noted that Test Nos. 4, 8, and 12 of Table 1 are comparative examples in which final solidification was completed without a top heater.

TABLE 1

| Test No. | Top heater | Ingot size (mm) | Induction coil frequency (kHz) | Cracking generation ratio in finally solidified part (%) |
|---|---|---|---|---|
| 1 | Single type, Not divided | 345 × 505 | 30 | 89 |
| 2 | Divided into two elements | " | " | 32 |
| 3 | Divided into three elements | " | " | 0 |
| 4 | Without top heater | " | " | 100 |
| 5 | Single type, Not divided | 345 × 345 | 30 | 55 |
| 6 | Divided into two elements | " | " | 0 |
| 7 | Divided into three elements | " | " | 0 |
| 8 | Without top heater | " | " | 100 |
| 9 | Single type, Not divided | 345 × 345 | 12 | 7 |
| 10 | Divided into two elements | " | " | 0 |
| 11 | Divided into three elements | " | " | 0 |
| 12 | Without top heater | " | " | 100 |

When Test Nos. 1 to 4, Test Nos. 5 to 8, and Test Nos. 9 to 12 of Table 1 are categorized as the same group, cracking is generated in a case of no top heater without any exception in any group. Meanwhile, when the top heater is used, the cracking generation ratio is reduced no matter what kind of divided-type top heater is used. By dividing the top heater into two elements and further into three elements, the cracking generation ratio is furthermore lowered as being evident from Table 1.

A difference between the group of Test Nos. 1 to 4 and the group of Test Nos. 5 to 8 is the size of the ingots. However, in the group of Test Nos. 1 to 4 in which a cross-sectional area of the ingots is large, the radiation heat from the top heater less easily reaches the entire top surface of the molten silicon (particular the vicinity of the central part) than the group of Test Nos. 5 to 8, and the cracking generation ratio becomes 0% just only by dividing the top heater into three elements.

A difference between the group of Test Nos. 5 to 8 and the group of Test Nos. 9 to 12 is the frequency of the current supplied to the induction coil. However, in the group of Test Nos. 5 to 8 in which the frequency is 30 kHz, the cracking generation ratio in the case where a single type, non-divided top heater is used is largely different from the group of Test Nos. 9 to 12. It seems that this is because, by increasing the frequency, the induction current was generated only on a surface layer of the top heater and hence the temperature of the molten silicon top surface layer, particularly in the vicinity of the central part thereof could not be sufficiently increased.

INDUSTRIAL APPLICABILITY

According to the silicon electromagnetic casting apparatus of the present invention, upon production of a polycrystalline silicon ingot in association with the plasma heating of the plasma arc, a high quality polycrystalline silicon ingot used as a solar cell substrate material can be stably produced without cracking in the final solidification portion.

Therefore, the present invention can be effectively utilized in the field of producing a solar cell and thus significantly contribute to the development of technologies using natural energy.

REFERENCE SIGNS LIST

1: Mold
2: Induction heating coil
3: Top heater
4: Molten silicon
5: Heat retention device
6: Sealed container
7: Support base
8: Ingot (silicon ingot)
9: Heat retention cylindrical body
10: Raw material feeder
11: Heating member

What is claimed is:

1. A silicon electromagnetic casting apparatus including:
   a conductive bottomless cold mold in which part thereof in an axial direction is divided into a plurality of elements along a circumferential direction; and
   an induction coil surrounding the mold, in which silicon is melted through electromagnetic induction heating by means of the induction coil and is pulled down to be solidified, and further comprising:
   a plasma torch as a heating source installed above the cold mold so as to be raised or lowered, the plasma torch generating a transferable plasma arc in continuous casting; and
   a top heater configured so as to face a top surface of the molten silicon in the cold mold, the top heater generating heat through electromagnetic induction by means of the induction coil in a final solidification step at which casting ends, the top heater comprising two or more divided heating members.

2. The silicon electromagnetic casting apparatus according to claim 1, wherein
   the top heater has a structure in which the top heater is suspended from the plasma torch.

3. The silicon electromagnetic casting apparatus according to claim 2, wherein
   the cold mold is a square or rectangular mold having a side length of 300 mm or more.

4. The silicon electromagnetic casting apparatus according to claim 2, wherein a frequency of an alternating current applied to the induction coil is 25 to 35 kHz.

5. The silicon electromagnetic casting apparatus according to claim 4, wherein the cold mold is a square or rectangular mold having a side length of 300 mm or more.

6. The silicon electromagnetic casting apparatus according to claim 1, wherein
   a frequency of an alternating current applied to the induction coil is 25 to 35 kHz.

7. The silicon electromagnetic casting apparatus according to claim 6, wherein
   the cold mold is a square or rectangular mold having a side length of 300 mm or more.

8. The silicon electromagnetic casting apparatus according to claim 1, wherein
   the cold mold is a square or rectangular mold having a side length of 300 mm or more.

* * * * *